United States Patent
Munoz Constantine et al.

(10) Patent No.: US 12,323,150 B2
(45) Date of Patent: Jun. 3, 2025

(54) DIGITALLY CALIBRATED SAWTOOTH GENERATOR FOR PWM BASED BUCK CONVERTERS

(71) Applicant: Intel Corporation, Santa Clara, CA (US)

(72) Inventors: Juan Munoz Constantine, Hillsboro, OR (US); Christopher Schaef, Hillsboro, OR (US); Ajay Janardanan, Hillsboro, OR (US); Alexander Lyakhov, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 680 days.

(21) Appl. No.: 17/517,573

(22) Filed: Nov. 2, 2021

(65) Prior Publication Data

US 2022/0060180 A1    Feb. 24, 2022

(51) Int. Cl.
*H03K 4/50*       (2006.01)
*H03K 4/08*       (2006.01)
*H03K 7/08*       (2006.01)
*H02M 3/158*      (2006.01)

(52) U.S. Cl.
CPC .............. *H03K 4/50* (2013.01); *H03K 4/08* (2013.01); *H03K 7/08* (2013.01); *H02M 3/158* (2013.01)

(58) Field of Classification Search
CPC ........ H02M 3/157; H02M 3/158; H03K 4/08; H03K 4/48; H03K 4/50; H03K 7/08
USPC ............... 327/131, 132, 134, 135, 136, 137
See application file for complete search history.

(56) References Cited

U.S. PATENT DOCUMENTS

| | | |
|---|---|---|
| 4,523,107 A | 6/1985 | Peterson |
| 4,940,930 A | 7/1990 | Detweiler |
| 7,391,242 B1 | 6/2008 | Ball |
| 9,825,527 B2 | 11/2017 | Zarkhin et al. |
| 2013/0335143 A1* | 12/2013 | Lee .......................... H03K 4/06 327/132 |
| 2014/0210534 A1* | 7/2014 | Wang ...................... H03K 7/08 327/175 |

* cited by examiner

*Primary Examiner* — William Hernandez
(74) *Attorney, Agent, or Firm* — Schwabe, Williamson & Wyatt, P.C.

(57) ABSTRACT

Embodiments herein relate to a circuit which generates a sawtooth waveform based on an adaptive feedback loop that self-corrects the ramp up rate to account for variations in a device. The sawtooth waveform is obtained by repeatedly charging and discharging a capacitor according to a clock signal. The sawtooth waveform can be sampled once per clock period at a comparator which provides a corresponding binary output to a state machine. If the binary output indicates the amplitude of the sawtooth waveform is below a desired maximum voltage, the state machine outputs a code word to a digitally-controlled variable current source to increase the output current. The sawtooth waveform can be used to provide a pulse-width modulated (PWM) waveform such as for a DC-DC converter.

20 Claims, 10 Drawing Sheets

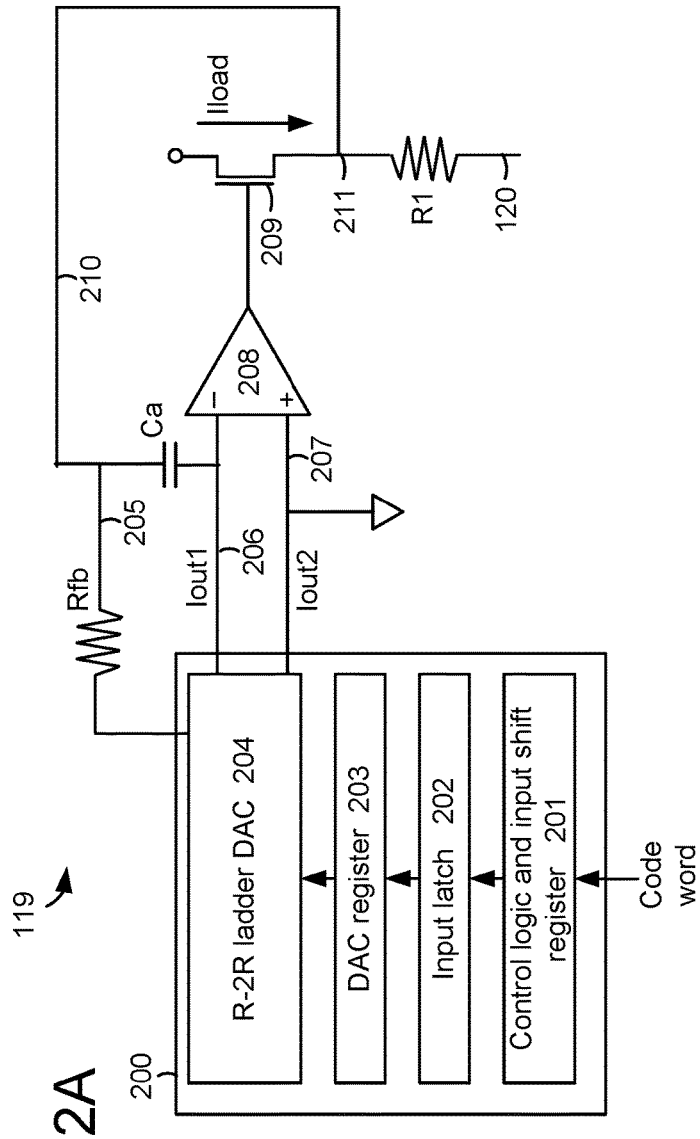
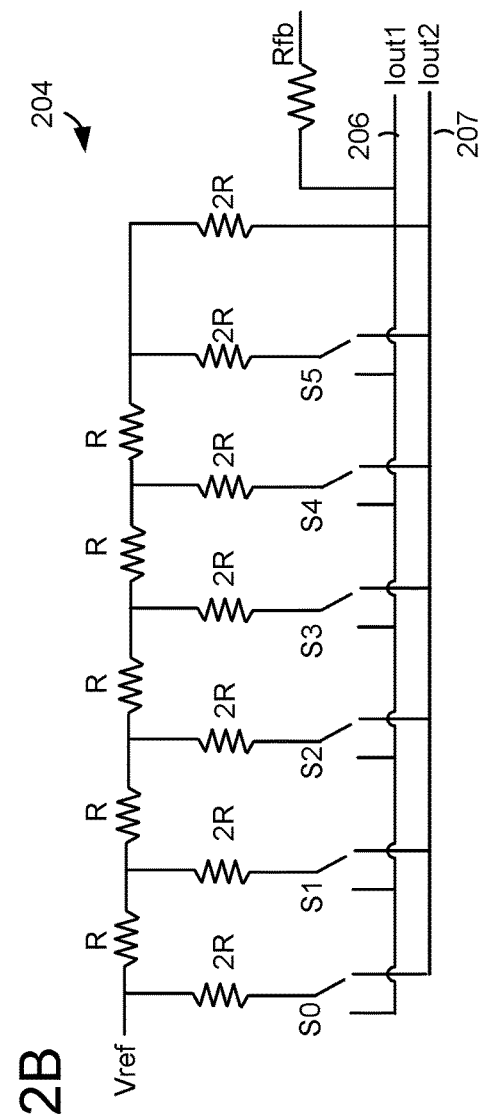
Fig. 2A
Fig. 2B

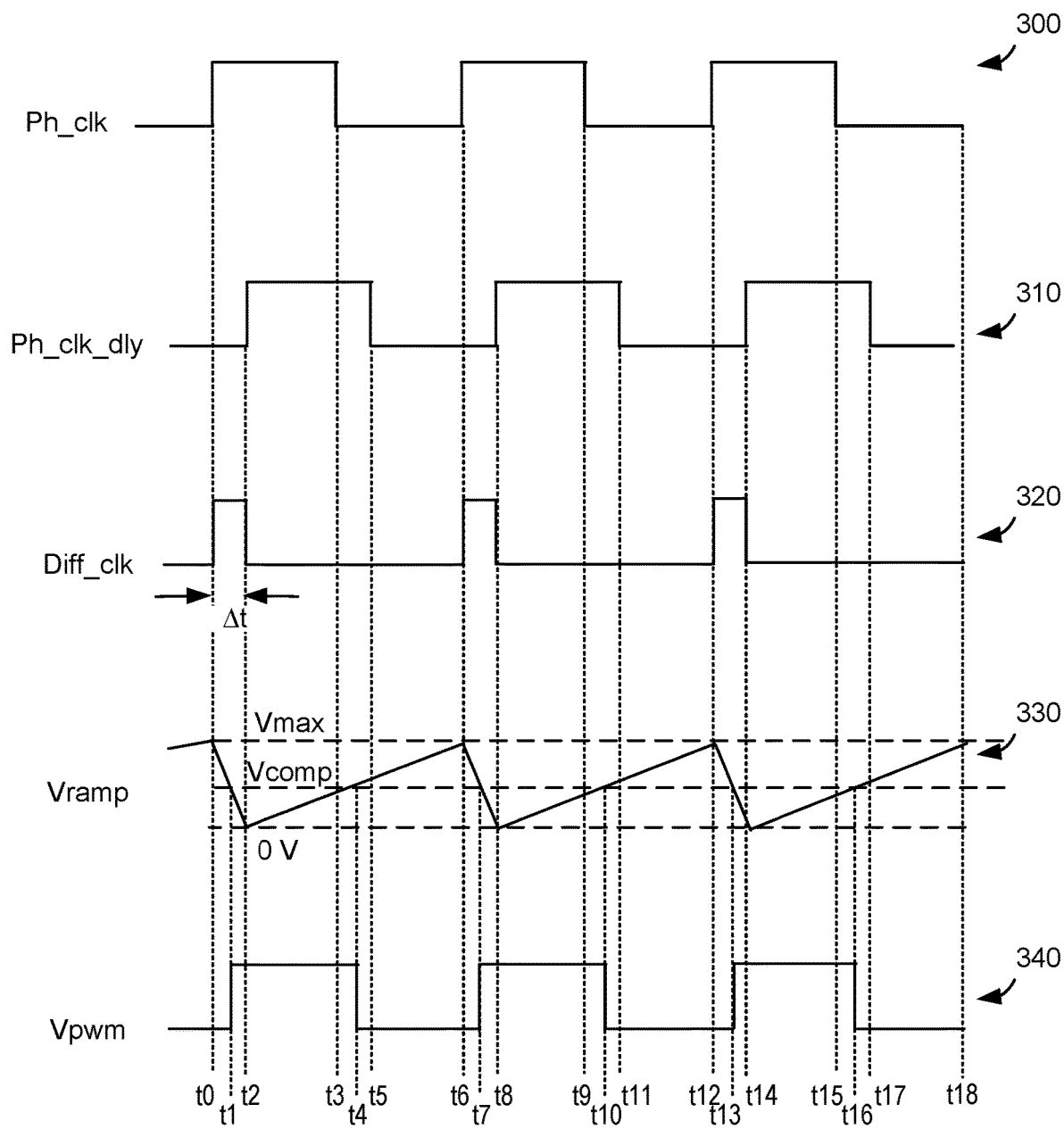

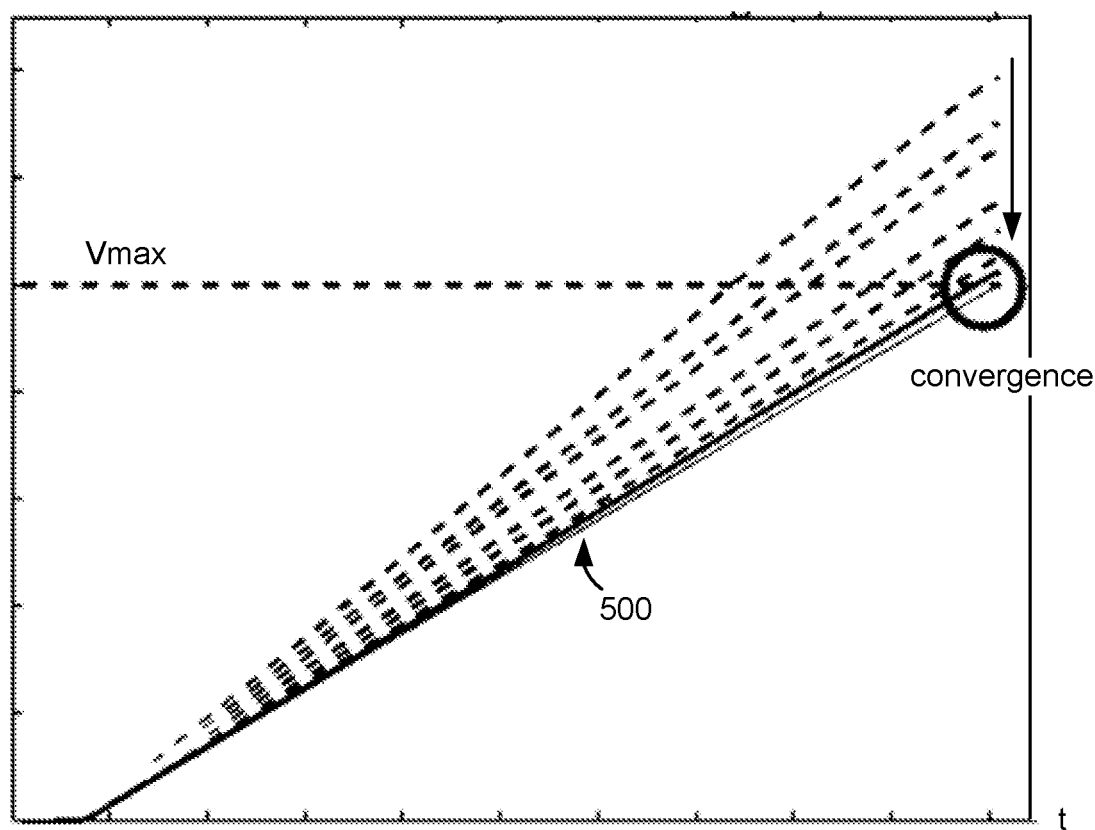

Fig. 8

Generate a clock waveform for a state machine, wherein the clock waveform is to trigger a state machine to sample an output of a first comparator, the sample of the output is to indicate whether a voltage across a first capacitor exceeds a first reference voltage, and the state machine is to adjust a variable current source connected to the first capacitor in response to the sample of the output 800

↓

Generate a delayed version of the clock waveform, wherein the clock waveform and the delayed version of the clock waveform are separated by a delay period, and, to provide a sawtooth waveform (Vramp) at a node of the first capacitor, a first switch, connected in parallel with the first capacitor, is to open to allow the variable current source to charge the first capacitor outside the delay period and the first switch is to close to discharge the first capacitor during the delay period 801

↓

A PWM waveform generator is to generate a PWM waveform based on a comparison between the sawtooth waveform and a comparison voltage (Vcomp) outside the delay period 802

A pulse-width modulated (PWM) waveform generator is to receive an upshifted version (Vramp+Vshift) of the sawtooth waveform from a second capacitor which is connected to the first capacitor 803

↓

The PWM waveform generator is to generate a PWM waveform based on a comparison between the upshifted version of the sawtooth waveform and a comparison voltage (Vcomp) outside the delay period 804

↓

The PWM waveform generator is to auto-zero itself during the delay period 805

DIGITALLY CALIBRATED SAWTOOTH GENERATOR FOR PWM BASED BUCK CONVERTERS

FIELD

The present application generally relates to the field of circuits, more specifically, to a circuit for generating a periodic waveform such as a sawtooth waveform.

BACKGROUND

Sawtooth waveforms have various applications in electronic circuits, including DC-to-DC power converters such as buck converters. Buck converters are useful for tasks such as converting the main supply voltage of a computing device, such as 12 V, down to lower voltages, such as 5 V, 3.3 V or 1.8 V. The lower voltages can be used by various components in the computing device. These include a Universal Serial Bus (USB) interface, memory such as dynamic random access memory (DRAM) and processing resources such as a central processing unit (CPU). The sawtooth waveform can be used to generate a pulse-width modulated (PWM) waveform which is used by the buck converter. However, various challenges are presented in providing these waveforms.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 2A illustrates an example implementation of the current source 119 of FIG. 1A, in accordance with various embodiments.

FIG. 2B illustrates an example implementation of the R-2R ladder DAC 204 of FIG. 2A, in accordance with various embodiments.

FIG. 3 depicts example waveforms in the circuit 100 of FIG. 1A.

FIG. 5 depicts an example plot of a peak of the sawtooth waveform, Vramp, in FIG. 1A versus time, showing the convergence of the amplitude to a target maximum level, Vmax, consistent with FIG. 4A.

FIG. 8 depicts a flowchart of an example process, in accordance with various embodiments.

DETAILED DESCRIPTION

Figure 1A:
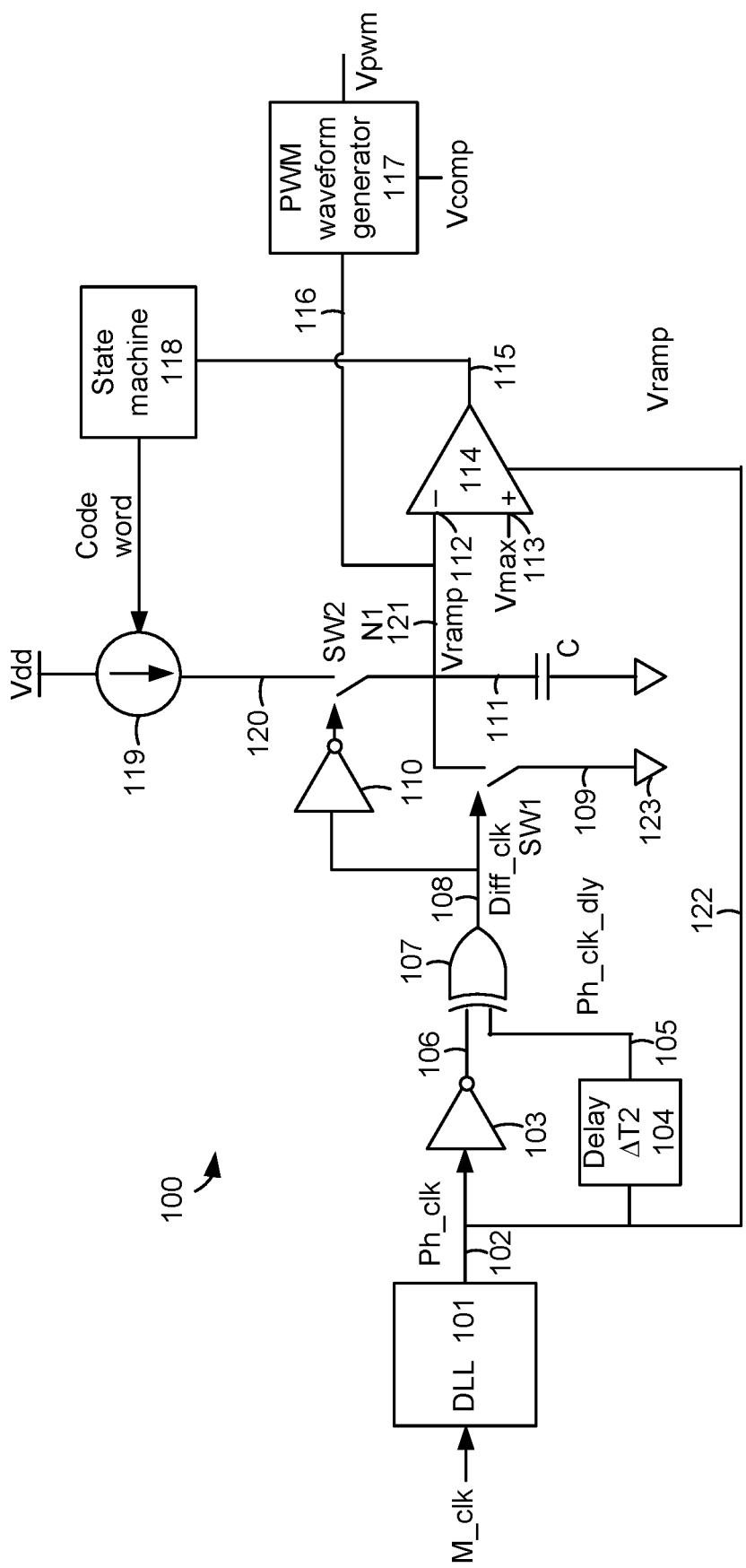
FIG. 1A illustrates an example circuit 100 which generates a sawtooth waveform for use by a pulse width-modulation (PWM) waveform generator using a digital error signal, in accordance with various embodiments.

In the following detailed description, reference is made to the accompanying drawings that form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The terms "substantially," "close," "approximately," "near," and "about," generally refer to being within +/−10% of a target value. Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B, and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group), a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

The terms "coupled," "communicatively coupled," along with derivatives thereof are used herein. The term "coupled" may mean two or more elements are in direct physical or electrical contact with one another, may mean that two or more elements indirectly contact each other but still cooperate or interact with each other, and/or may mean that one or more other elements are coupled or connected between the elements that are said to be coupled with each other. The term "directly coupled" may mean that two or more elements are in direct contact with one another. The term "communicatively coupled" may mean that two or more elements may be in contact with one another by a means of communication including through a wire or other interconnect connection, through a wireless communication channel or link, and/or the like.

As mentioned at the outset, sawtooth waveforms have various applications in electronic circuits, including DC-to-DC power converters such as buck converters. In a DC-DC converter, a sawtooth or triangular waveform generator is a fundamental circuit block to generate a pulse-width modulated (PWM) waveform to control power field effect transistors (FETs) in the buck converter. However, there are many challenges associated with designing an accurate sawtooth waveform and associated PWM waveform. For example, the ramp rate and the voltage range of the sawtooth waveform should be carefully set. Other factors include addressing process, voltage and temperature (PVT) variations of passive components and other circuit components. The architectural complexity and power consumption should also be considered.

The techniques provided herein address the above and other issues by providing a circuit which generates a sawtooth waveform based on an adaptive feedback loop that will self-correct the ramp rate variation due to any system and/or random variations in the device. The architecture minimizes complexity and reduces power consumption.

In one aspect, a sawtooth waveform periodically varies between 0 V and a maximum voltage. In another aspect, an upshifted sawtooth waveform periodically varies between a positive minimum voltage and an upshifted maximum voltage.

The sawtooth waveform can be obtained by repeatedly charging and discharging a capacitor according to a clock signal. The capacitor can be charged by an analog or digitally-controlled variable current source. The sawtooth waveform can be sampled once per clock period at a comparator. For an analog variable current source, the comparator provides a corresponding analog output to the current source to adjust an output current of the current source.

For a digitally-controlled variable current source, the comparator provides a corresponding binary output to a state machine. If the binary output indicates the amplitude of the sawtooth waveform is below a desired maximum voltage, the state machine outputs a code word to a digitally-controlled variable current source to increase the output current. If the binary output indicates the amplitude of the sawtooth waveform is above the desired maximum voltage, the state machine outputs a code word to the current source to decrease the output current.

In one aspect, the PWM waveform or signal is generated using a comparator which receives the sawtooth waveform at its inverting input terminal and a comparison voltage at its non-inverting input terminal. The comparator outputs a high output when the sawtooth waveform amplitude is below the comparison voltage, and a low output when the sawtooth waveform amplitude is above the comparison voltage. The duty cycle of the PWM waveform can be adjusted by adjusting the comparison voltage. In particular, the duty cycle can be reduced by reducing the comparison voltage.

In another aspect, a second capacitor is used to upshift the sawtooth waveform, and the upshifted sawtooth waveform is input to a comparator to generate the PWM waveform. Additionally, the comparator can operate in an auto-zero mode in which its output is coupled to its inverting input node to correct for an offset of the comparator.

The above and other advantages are discussed further below.

FIG. 1A illustrates an example circuit 100 which generates a sawtooth waveform for use by a pulse width-modulation (PWM) waveform generator using a digital error signal, in accordance with various embodiments. The circuit receives a reference clock waveform, M_clk, at a delay-locked loop (DLL) 101. The DLL determines the period of the reference clock by adjusting the delay of a variable delay buffer in a feedback loop. The loop is locked when the output clock waveform, Ph_clk, on a path 102, matches the incoming clock waveform. The DLL and/or a circuit which provides M_clk are examples of a clock waveform generator which provides a clock waveform.

Ph_clk is provided to an inverter 103, which provides an inverted output on a path 106, and to a delay circuit 104, which provides a delayed clock waveform or signal on a path 105. One example of a delay circuit is an analog delay line, which is a network of electrical components connected in cascade, where each individual element creates a time difference between its input and output. For example, many sample-and-hold circuits can be connected in series.

The paths 105 and 106 are provided to an XOR gate 107 having an output clock, Diff_clk, on a path 108. Diff_clk is a difference clock which is high when there is a difference between Ph_clk and Ph_dly_clk. See FIG. 3, for example, Diff_clk is high from t0-t1, when Ph_clk is high and Ph_clk_dly is low. Diff_clk is low at other times. The time period in which Diff_clk is high is a time period in which the capacitor C is discharged.

Diff_clk is used to control a first switch SW1, while the inverse of Diff_clk is obtained from an inverter 110 to control a second switch SW2. SW1 is coupled to a discharge point 123 such as ground by a path 109. A discharge point refers to a point in a circuit which has a lower voltage than that of C1 such that C1 can discharge to the point. SW2 is coupled by a path 120 to a current source 119, and by a path 111 to the capacitor C. Consistent with FIG. 3, when Diff_clk is high, SW1 is closed (conductive) and SW2 is open (non-conductive) to discharge C1. When Diff_clk is low, SW1 is open to prevent the capacitor C from discharging and SW2 is closed to allow the capacitor C to be charged by the current source 119.

A path 121 or node N1 (a first node) is also coupled to the capacitor C to provide the sawtooth waveform, Vramp, as the voltage at a top node or plate of the capacitor C. This is the same as the voltage stored by the capacitor C when the discharge point 123 is grounded. Vramp is provided to an inverting input terminal 112 of a comparator 114 via a path 122, while Vmax, a desired maximum level of Vramp, is provided to a non-inverting terminal 113 of the comparator. Vmax is a first reference voltage for the comparator. The comparator compares Vramp to Vmax and outputs a high voltage, e.g., a 1 bit, if Vmax is greater than Vramp, or a low voltage, e.g., a 0 bit, if Vmax is less than Vramp. The high voltage may be a power supply voltage of the device such as Vdd. The binary output signal of the comparator is sampled by a state machine 118 according to a clock, such as discussed in connection with FIG. 3. For example, it may be sample once per the period of Ph_clk. The binary output signal is sampled on a path 115, which represents an output terminal of the comparator 114. The state machine is in a feedback path from the comparator to the current source 119.

The state machine may be a finite state machine for digital calibration. The state machine transitions between a finite number of states based on the bit sample from the comparator, where each state corresponds to a different code word. The state machine receives the bit from the output terminal of the comparator and determines an adjustment for the current source 119. The adjustment may be in the form of a multi-bit code word, for example. For instance, a six-bit code word represents sixty-four different current output levels for the current source. The current source can include a digital-to-analog converter (DAC) for processing the code word, such as depicted in FIG. 2A.

The state machine can adjust its current output in various ways. In one approach, the code word changes by one bit (a single bit) in response to the bit of the output signal. For example, if a 1 bit is received, indicating Vmax is greater than Vramp, the state machine can increase the current code word by one bit to indicate that the current source should increase its current output by a corresponding analog increment. If a 0 bit is received, indicating Vmax is less than Vramp, the state machine can decrease the current code word by one bit to indicate that the current source should decrease its current output by a corresponding analog increment. The current source generates a current using a supply voltage Vdd of the device in which the circuit is provided.

In another approach, the code word changes by multiple bits in response to the sample of the output signal. For example, the code word can change by ten bits in response to the output bit. The state machine could also store multiple bit values/samples to obtain a history of the bit samples, and adjust the code word based on the history. For example, if several consecutive bit samples indicate more current is needed, this indicates the current can be increased by a greater amount than if the consecutive bit samples alternated between 0 and 1. Another approach is to use a binary search algorithm to identify an optimum current and corresponding code word. The state machine could also account for factors such as temperature in adjusting the code word.

By adjusting the code word in each clock period of Ph_clk, a feedback loop is provided in which the peak value of Vramp in a clock period of Ph_clk converges at Vmax. See FIG. 4A.

The PWM waveform generator 117 compares the amplitude of Vramp on the path 116 to Vcomp, a comparison voltage. Vcomp is also a second reference voltage. If Vramp<Vcomp, the PWM output signal, Vpwm, is set high. If Vramp>Vcomp, Vpwm is set low. See FIG. 3, plots 330 and 340. As mentioned, the duty cycle of the PWM waveform can be reduced by reducing Vcomp.

The feedback path in FIG. 1A creates an I/C slope in which a current (I) controls a capacitance (C). The PWM waveform generator 117 can be a switched capacitor based comparator which avoids the need for a linear voltage regulator to set the high and low levels of the sawtooth waveform, thereby minimizing power consumption. Due to the adaptive nature of the feedback loop, the circuit can compensate for drifts in the I/C slope due to external changes such as supply voltage or temperature. Furthermore, it can correct for both systematic and random variations from die to die. The sawtooth waveform can also adapt to multiple frequencies of operation without the need for external configurability.

Figure 1B:
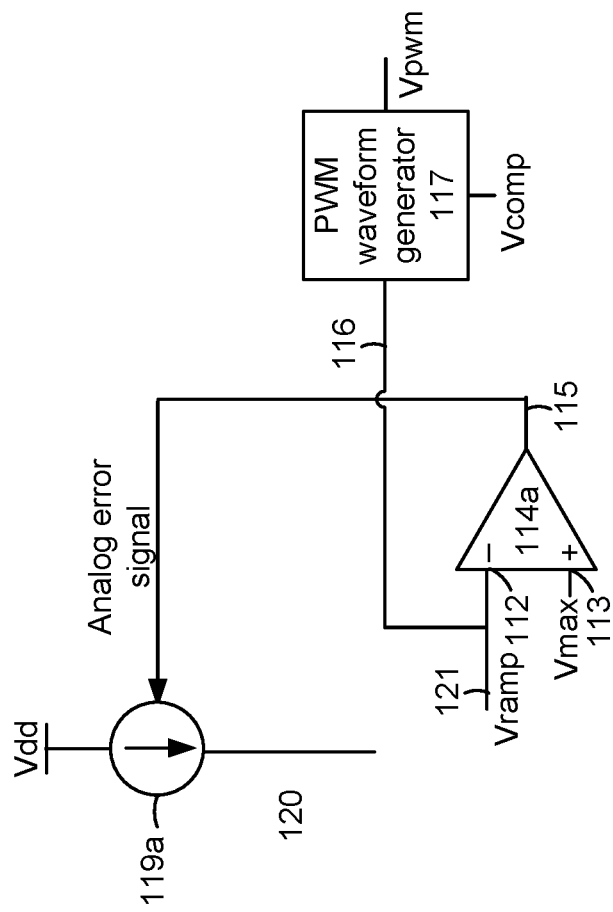
FIG. 1B illustrates an example circuit 100 which generates a sawtooth waveform for use by a pulse width-modulation (PWM) waveform generator using an analog error signal, in accordance with various embodiments.

FIG. 1B illustrates an example circuit 100 which generates a sawtooth waveform for use by a pulse width-modulation (PWM) waveform generator using an analog error signal, in accordance with various embodiments. A portion of the circuit of FIG. 1A is depicted. The state machine 118 is omitted and the comparator 114 is replaced by an operational amplifier 114a with an analog error signal on the path 115. The digitally controlled current source 119 is also replaced by an analog current source 119a. The amplitude of the error signal is a function of the different between Vramp and Vmax. With this approach, an error signal is sampled according to Ph_clk to provide the error signal. The current source, in response, adjusts its output higher or lower to converge Vramp to Vmax.

FIG. 2A illustrates an example implementation of the current source 119 of FIG. 1A, in accordance with various embodiments. Block 200 is a functional block diagram of a current output DAC. The block includes a control logic and input shift register 201 which receives the code word from the state machine. An input latch 202 receives the code word from the control logic and input shift register 201. A DAC register 203 in turn applies the code word to an R-2R ladder DAC. In the R-2R ladder circuit, each bit of the code word controls a different branch of the circuit to provide the currents Iout and Iout2. See FIG. 2B for an example implementation.

The block 200 provides Iout1 on a path 206 to the inverting terminal of an operational amplifier 208, and Iout2 on a grounded path 207 to the non-inverting input terminal of the operational amplifier 208. The op amp provides an output voltage to a control gate of a transistor 209 such as an nMOSFET, to modulate a current, Iload. The current is carried on a path 211 to a resistor R1 and then to the path 120 for charging the capacitor. The current is also carried on a feedback path 210 to a capacitor Ca, and to a feedback resistor Rfb on a path 205.

FIG. 2B illustrates an example implementation of the R-2R ladder DAC 204 of FIG. 2A, in accordance with various embodiments. The circuit includes a number of resistors arranged in a ladder configuration. The resistors in series have a resistance R and the resistors in parallel have a value 2R. Each parallel resistor is coupled to a respective switch S0-S5, where each switch is controlled by a respective bit in the code word. Based on the code word, the currents Iout1 and Iout2 are output on paths 206 and 207, respectively.

FIG. 3 depicts example waveforms in the circuit 100 of FIG. 1A. The waveforms are on a common time line with time points t0-t18. As discussed in connection with FIG. 1A, Ph_clk (plot 300) is the clock waveform or signal which is output from the DLL 101. Ph_clk has a period which extends from t0-t6, t6-t12 and t12-t18. Ph_clk_dly (plot 310) is the delayed version of Ph_clk, where the delay Δt extends from t0-t2, t6-t8 and t12-t14, for example. Diff_clk (plot 320) represents a difference between Ph_clk and Ph_clk_dly, and is high at t0-t2, t6-t8 and t12-t14. Vramp (plot 330) represents the sawtooth waveform which is input to the comparator 114. In each period of Ph_clk, Vramp decreases and then increases.

Figure 4A:
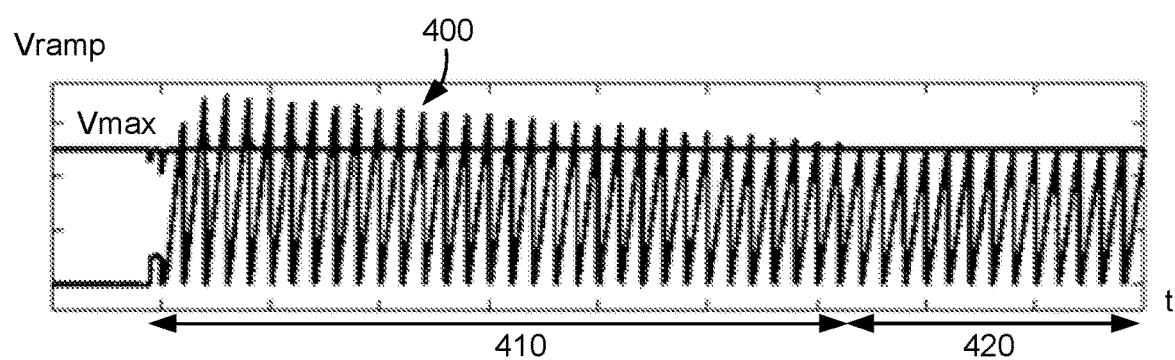
FIG. 4A depicts an example plot of an amplitude of the sawtooth waveform, Vramp, in FIG. 1A versus time, showing the convergence of the amplitude to a target level, Vmax.

In this example, the circuit is stable such that Vramp varies repeatedly between 0 V and Vmax. When the circuit is first started, there will be a convergence time needed to stabilize, such as depicted in FIG. 4A. Vramp decreases at t0-t2, t6-t8 and t12-t14. In this example, Vramp is shown as reaching 0 V just before it begins to increase, at t2, t8 and t14. However, Vramp could reach 0 V and remain at that level for some time before increasing again. The decrease and increase in Vramp is due to the discharging and charging, respectively, of the capacitor C in FIG. 1A, for example, as discussed.

Vcomp is the comparison voltage used by the PWM waveform generator 117 to compare with Vramp. The comparison can be done continuously in each clock period as Vramp changes. Based on the result of the comparison, Vpwm (plot 340) is set to high or low, as discussed. In this example Vpwm transitions from high to low at t4, t10 and t16 and from low to high at t1, t7 and t13.

The techniques described herein are illustrated using a sawtooth waveform of the type which ramps up continuously over a relatively long period, e.g., at least 70% of a clock period, then discharges over a relatively short period, e.g., less than 30% of a clock period. However, other analogous types of waveforms can be used such as a triangular waveform. A triangular waveform has a symmetric increase and decrease such that the waveform ramps up continuously over the first 50% of a clock period, then discharges over the next 50% of the clock period.

Generally, the range of the sawtooth waveform can be selected such that its minimum level is above the minimum level of an error amplifier in a PWM waveform generator. Also, the maximum level should be below the maximum level of the error amplifier. Thus, the error voltage signal from the error amplifier can rise above and fall below the signal range of the sawtooth. This ensures that a DC-DC converter has a duty cycle range of 0-100%. However, having a signal start at any level above zero requires some sort of regulation of that lower threshold. This regulation makes the circuit power hungry. The techniques discussed in connection with FIG. 1A start the ramp at 0 V (ground) while the maximum level of the sawtooth waveform is dictated by the comparator 114. The techniques discussed in connection with FIG. 6 leverage switch capacitor comparators to shift the DC levels of the sawtooth waveform.

Another challenge in generating a sawtooth waveform is the tradeoff of ramp rate accuracy and implementation complexity. PVT variations and die-to-die variations can significantly impact the ramp rate accuracy when the circuit sources current into a capacitor. The techniques herein simplify this trade off by implementing an adaptive feedback method to self-tune the ramp rate in each cycle.

Advantageously, the same DC-DC converter architecture can be used with a wide range of switching frequencies. The designers no longer must size the capacitor and current source for a given frequency of operation. Instead, a current DAC with enough range to cover the potential frequencies can be used. The adaptive nature of the circuit ensures that the ramp increases from a desired initial level to a desired final level within a clock period.

FIG. 4A depicts an example plot of an amplitude of the sawtooth waveform, Vramp, in FIG. 1A versus time, showing the convergence of the amplitude to a target level, Vmax. When the circuit 100 of FIG. 1A starts up, time is needed for the peak value of Vramp to stabilize at Vmax. In this example, Vramp (plot 400) is initially greater than Vmax, in a time period 410. The ramp up rate is therefore initially too high. Vramp subsequently stabilizes in a following time period 420. The stabilization or convergence to Vmax is due to the adjustments to the current source in a feedback loop, as discussed.

Figure 4B:
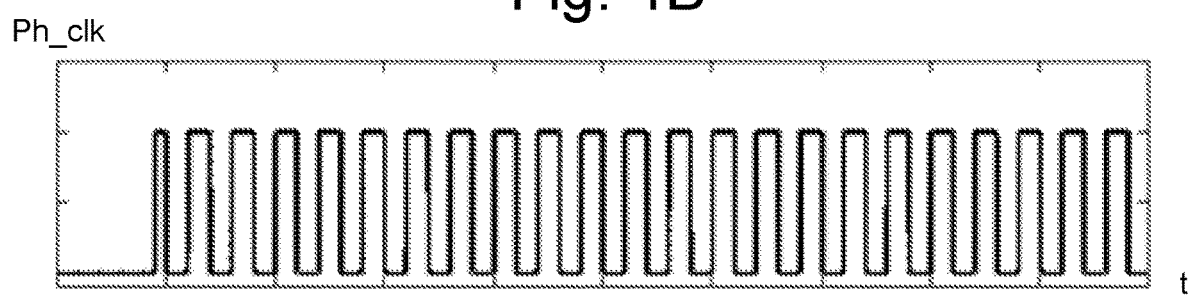
FIG. 4B depicts an example plot of an amplitude of the clock waveform, Ph_clk, in FIG. 1A versus time, consistent with FIG. 4A.

FIG. 4B depicts an example plot of an amplitude of the clock waveform Ph_clk in FIG. 1A versus time, consistent with FIG. 4A. The first period of the clock waveform is shortened due to an artifact. The subsequent periods are fixed in this example.

FIG. 5 depicts an example plot of a peak of the sawtooth waveform Vramp in FIG. 1A versus time, showing the convergence of the amplitude to a target maximum level, Vmax, consistent with FIG. 4A. Each of the lines 500 represents the peak amplitude of Vramp, Vramp peak, over a period of Ph_clk. The arrow shows the evolution of Vramp peak over successive periods. The circle represents a point of convergence, where Vramp peak=Vmax.

Figure 6:
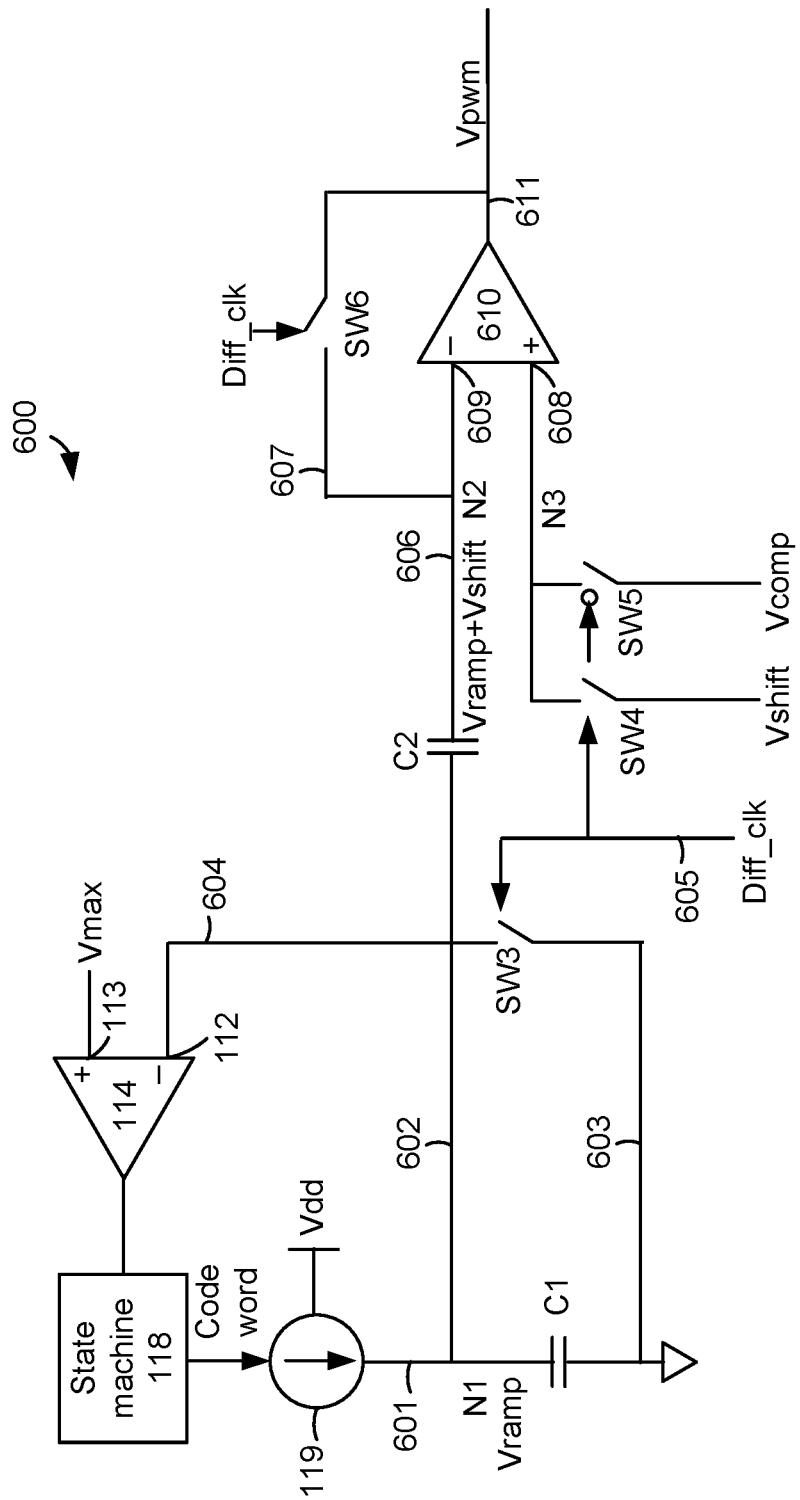
FIG. 6 illustrates an example circuit 600 which generates an upshifted version of a sawtooth waveform for use by a PWM waveform generator, in accordance with various embodiments.
Figure 7:
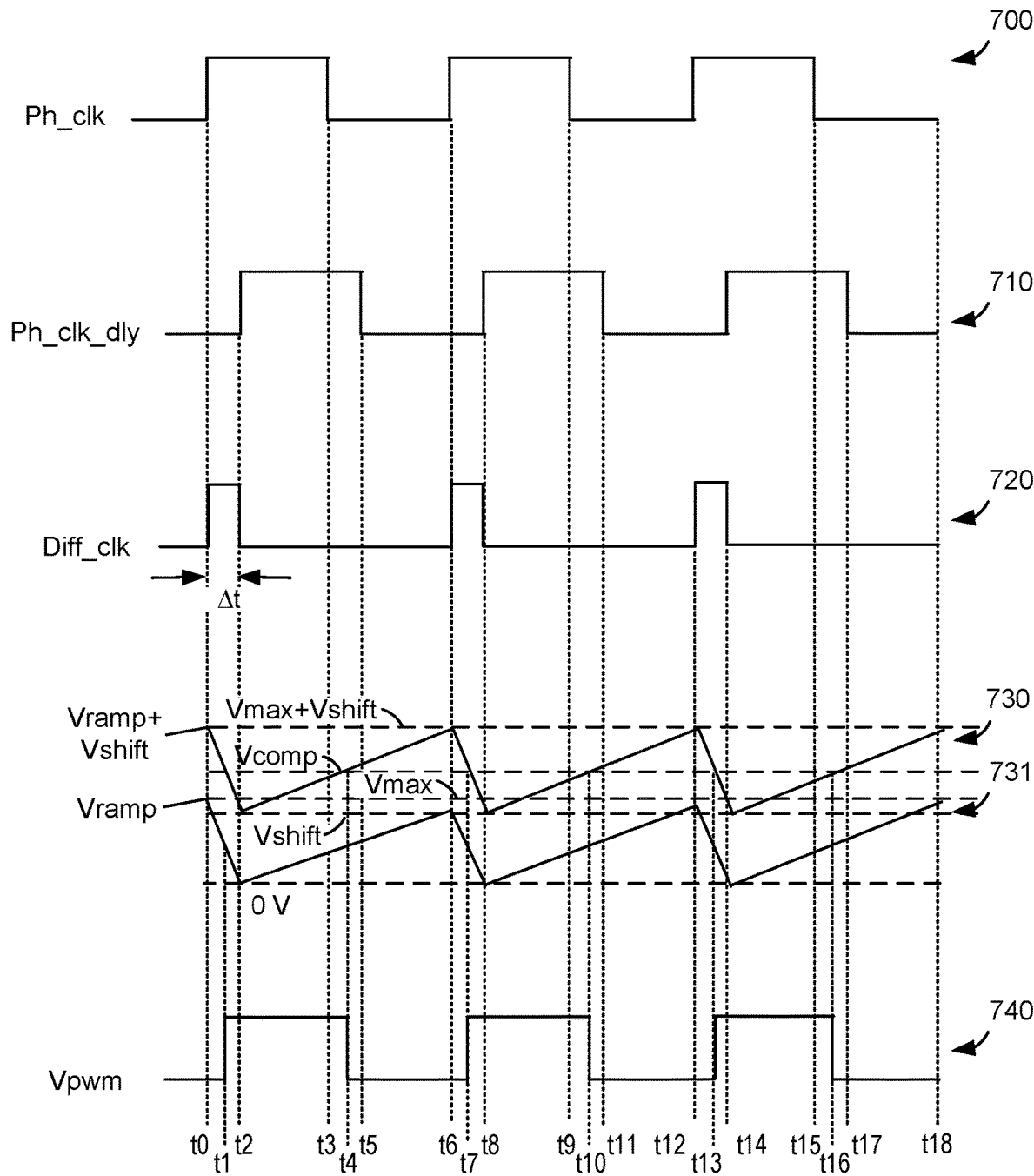
FIG. 7 depicts example waveforms in the circuit 600 of FIG. 6.

FIG. 6 illustrates an example circuit 600 which generates an upshifted version of a sawtooth waveform for use by a PWM waveform generator, in accordance with various embodiments. Referring to FIG. 7, an upshifted version of the sawtooth waveform varies between a minimum level, Vshift, and a target maximum level, Vmax=Vshift. Vshift represents the amount of upshift or increase in voltage. Vshift is less than Vmax in this example, but Vshift could be greater than Vmax. An upshifted sawtooth waveform can be desirable such as based on the specifications of the PWM waveform generator.

The circuit 600 of FIG. 6 includes the first comparator 114, state machine 118 and current source 119, as discussed in connection with FIG. 1A. The components of FIG. 1A can be used to provide Diff_clk on a path 605 to control switches SW3, SW4 and SW5. When Diff_clk is high, SW3 and SW4 are closed and SW5 is open. This is a time period in which the capacitor C1 is discharging. When Diff_clk is low, SW3 and SW4 are open and SW5 is closed. This is a time period in which the capacitor C1 is charging.

The circuit includes a node N1 in which the voltage Vramp is provided. This node can be considered to be a node, plate or side of the first capacitor C1. The other node, plate or side of the capacitor is coupled to ground or another discharge potential. When SW3 is open, the current from the current source is blocked from going to ground, so that the capacitor C1 is charged by the current source via the path 601. SW3 is in a path which is parallel to the path between N1 and ground. When SW3 is closed, the current from the current source goes to ground via the path 602, the switch SW3 and the path 603. In this case, C1 is not charged and, instead, discharges to ground.

Vramp is provided from N1 (a first node) to the inverting input terminal 112 via the paths 602 and 604. Vramp is also provided to a second capacitor C2 which is in series with N2 (a second node) and path 602 and 606. When Diff_clk is low, Vramp increases so that the voltage on the path 606 also increases by an upshift amount which is the first voltage, Vshift, across C2. Vramp+Vshift is therefore provided on the path 606. See FIG. 7 at plots 730 and 731. When Diff_clk is low, SW5 is closed so that Vcomp, a second voltage, is provided on a node N3 (a third node) to the non-inverting input terminal 608 of a comparator 610. The comparator compares Vcomp to Vramp+Vshift on a node N2 and the inverting input terminal 609 to provide Vpwm on the path 611 (output terminal). For example, the second comparator 610 can output a high output when Vramp+Vshift is below Vcomp, and a low output when Vramp+Vshift is above Vcomp.

When Diff_clk is high, SW4 is closed and SW5 is open so that Vshift is provided on N3. SW6 is also closed so that the output terminal of the comparator is coupled to N2 and the inverting input terminal 609. SW6 is in a switched path 607. At this time, N2 is at a level of Vshift+an offset voltage of the comparator. The comparator essentially samples its offset on to the capacitor C2. The offset voltage is the voltage that must be applied between the two input terminals of the comparator to obtain 0 V at the output. Ideally the output should be at 0 V when the inputs are grounded but, in practice, the input terminals are at slightly different DC potentials. The offset voltage may be about 2-3 mV, for example, and can be caused by factors such as mismatches between transistors. N2 is connected in a unity gain configuration. At this time, Vshift+offset voltage is maintained at one side of the capacitor C2 which is coupled to N2. As C1 discharges, 0 V is provided at the other side of C2, so that Vshift+offset voltage is stored across C2. Ignoring the offset, the voltage across C2 is Vshift. This provides the upshift in Vramp, to provide Vramp+Vshift at N2. By setting N2 to Vshift+offset voltage, the comparator is auto-zeroed. The auto-zeroing can be performed when C1 is discharging.

When C1 is charging, both Vramp and Vramp+Vshift increase together by the same amount. When C1 discharges, both Vramp and Vramp+Vshift decrease together by the same amount. In this manner, an upshifted sawtooth waveform is provided to the comparator 610, which acts as a PWM waveform generator.

FIG. 7 depicts example waveforms in the circuit 600 of FIG. 6. The waveforms are on a common time line with time points t0-t18. As discussed, Ph_clk (plot 700) has a period which extends from t0-t6, t6-t12 and t12-t18. Ph_clk_dly (plot 710) is the delayed version of Ph_clk. Diff_clk (plot 720) represents a difference between Ph_clk and Ph_clk_dly, and is high at t0-t2, t6-t8 and t12-t14. Vramp (plot 730) represents the sawtooth waveform at the node N1 in FIG. 6, and Vramp+Vshift (plot 731) represents the upshifted sawtooth waveform at the node N2 in FIG. 6 which is input to the comparator 610. Vshift is the amount of the upshift. In each period of Ph_clk, Vramp decreases and then increases. Vmax+Vshift is the target maximum level of the upshifted sawtooth waveform. Vshift is a positive minimum voltage and Vmax+Vshift is an upshifted maximum voltage.

Vramp and Vramp+Vshift decrease at t0-t2, t6-t8 and t12-t14. In this example, Vramp+Vshift is shown as reaching Vshift just before it begins to increase, at t2, t8 and t14. However, Vramp+Vshift could reach Vshift and remain at that level for some time before increasing again.

Vcomp is the comparison voltage used by the comparator 610 (a PWM waveform generator) to compare with Vramp+Vshift. The comparison can be done continuously as Vramp+Vshift changes. Based on the result of the comparison, Vpwm (plot 740) is set to high or low, as discussed. In this example Vpwm transitions from high to low at t4, t10 and t16 and from low to high at t1, t7 and t13.

In an example implementation, Vshift=400 mV, Vmax=500 mV and Vcomp=700 mV.

FIG. 8 depicts a flowchart of an example process, in accordance with various embodiments. Step 800 includes generating a clock waveform for a state machine, wherein the clock waveform is to trigger a state machine to sample an output of a first comparator, the sample of the output is to indicate whether a voltage across a first capacitor exceeds a first reference voltage, and the state machine is to adjust a variable current source coupled to the first capacitor in response to the sample of the output. Step 801 includes generating a delayed version of the clock waveform, wherein the clock waveform and the delayed version of the clock waveform are separated by a delay period, and, to provide a sawtooth waveform (Vramp) at a node of the first capacitor, the first switch, coupled in parallel with the first capacitor, is to open to allow the variable current source to charge the first capacitor outside the delay period and the first switch is to close to discharge the first capacitor during the delay period.

In one option consistent with FIG. 1A, where the sawtooth waveform is not upshifted, at step 802, a PWM waveform generator is to generate a PWM waveform based on a comparison between the sawtooth waveform and a comparison voltage (Vcomp) outside the delay period.

In another option consistent with FIG. 6, where the sawtooth waveform is upshifted, at step 803, a pulse-width modulated (PWM) waveform generator is to receive an upshifted version (Vramp+Vshift) of the sawtooth waveform from a second capacitor which is coupled to the first capacitor. At step 804, the PWM waveform generator is to generate a PWM waveform based on a comparison between the upshifted version of the sawtooth waveform and a comparison voltage (Vcomp) outside the delay period. At step 805, the PWM waveform generator is to auto-zero itself during the delay period.

The process or method can be performed partially or wholly by software or other instructions provided in a machine-readable storage medium (e.g., memory). The software is stored as processor-executable instructions (e.g., instructions to implement any other processes discussed herein). Instructions associated with the flowchart (and/or various embodiments) and executed to implement embodiments of the disclosed subject matter may be implemented as part of an operating system or a specific application, component, program, object, module, routine, or other sequence of instructions or organization of sequences of instructions.

The storage medium can be a tangible machine readable medium such as read only memory (ROM), random access memory (RAM), flash memory devices, floppy and other removable disks, magnetic storage media, optical storage media (e.g., Compact Disk Read-Only Memory (CD ROMS), Digital Versatile Disks (DVDs)), among others.

The storage medium may be included, e.g., in a communication device, a computing device, a network device, a personal digital assistant, a manufacturing tool, a mobile communication device, a cellular phone, a notebook computer, a tablet, a game console, a set top box, an embedded system, a TV (television), or a personal desktop computer.

Figure 9:
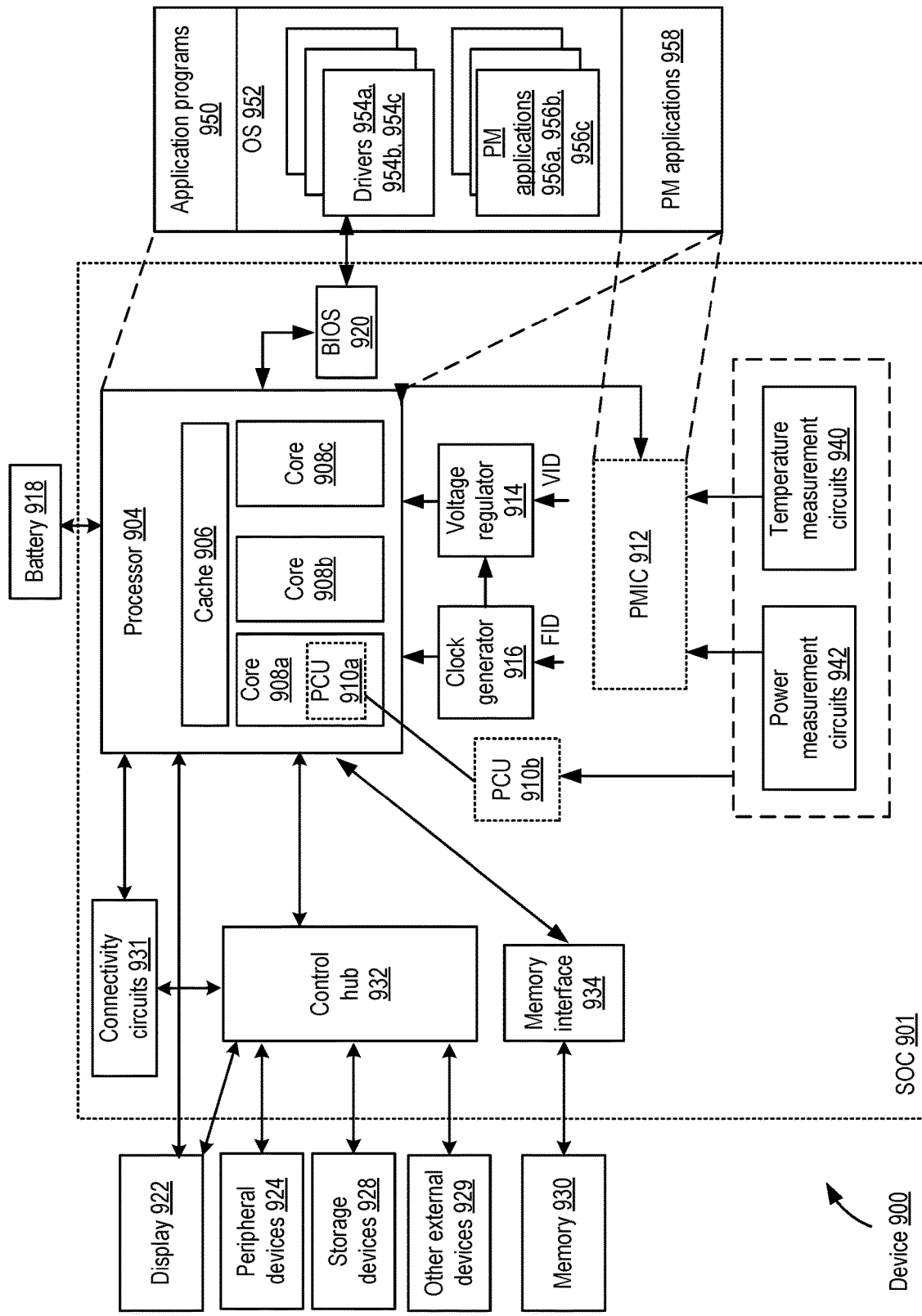
FIG. 9 illustrates a smart device or a computer system or a System-on-Chip (SoC) with apparatus and/or software in accordance with some embodiments.

FIG. 9 illustrates a smart device or a computer system or a System-on-Chip (SoC) with apparatus and/or software in accordance with some embodiments. In some embodiments, device 900 represents a computing device such as a computing tablet, a mobile phone or smartphone, a laptop, a desktop, an Internet-of-Things (IOT) device, a server, a wearable device, a set-top box, a wireless-enabled e-reader, or the like. It will be understood that certain components are shown generally, and not all components of such a device are shown in device 900.

In an example, the device 900 comprises a SoC (System-on-Chip) 901. An example boundary of the SoC 901 is illustrated using dotted lines, with some example components being illustrated to be included within the SoC.

In some embodiments, device 900 includes a processor 904. Processor 904 can include one or more physical devices, such as microprocessors, application processors, microcontrollers, programmable logic devices, or processing cores. The processing operations performed by processor 904 can include the execution of an operating platform or operating system on which applications and/or device functions are executed. The processing operations can include operations related to I/O (input/output) with a human user or with other devices, operations related to power management, operations related to connecting computing device 900 to another device. The processing operations may also include operations related to audio I/O and/or display I/O.

In some embodiments, the processor 904 includes multiple processing cores such as the example cores 908*a*, 908*b*, 908*c*. The cores may be implemented on a single integrated circuit (IC) chip which may include one or more shared and/or private caches, buses or interconnections, graphics and/or memory controllers, or other components.

In some embodiments, the processor 904 includes a cache 906. Sections of the cache 906 may be dedicated to individual cores or one or more sections of the cache 906 may be shared among two or more cores. The cache 906 may be split in different levels, e.g., level 1 (L1) cache, level 2 (L2) cache and level 3 (L3) cache.

In some embodiments, the processor 904 may include a fetch unit to fetch instructions from any storage devices such as the memory 930, for execution by the processor 904.

In some embodiments, the device 900 comprises connectivity circuits 931 such as hardware devices (e.g., wireless and/or wired connectors and communication hardware) and/or software components (e.g., drivers, protocol stacks), e.g., to enable the device 900 to communicate with external devices. The device 900 may be separate from the external devices, such as other computing devices, wireless access points or base stations, etc.

In some embodiments, the device 900 comprises a control hub 932, which represents hardware devices and/or software components related to interaction with one or more I/O devices. For example, the processor 904 may communicate with a display 922, peripheral devices 924, storage devices 928, and external devices 929 via the control hub 932. The control hub 932 may be a chip set, a Platform Control Hub (PCH), or the like.

The control hub 932 may connect additional devices to the device 900, e.g., through which a user might interact with the system. For example, connectivity circuits 931 may be coupled to the control hub 932, e.g., in addition to, or instead of, being coupled directly to the processor 904.

In some embodiments, the device 900 comprises a memory 930 coupled to the processor 904 via a memory interface 934. The memory 930 includes memory devices for storing information.

In some embodiments, the device 900 comprises temperature measurement circuits 940, e.g., for measuring temperature of various components of device 900. In an example, temperature measurement circuits 940 may be embedded, or coupled or attached to various components, whose temperature are to be measured and monitored. For example, temperature measurement circuits 940 may measure temperature of (or within) one or more of cores 908a, 908b, 908c, voltage regulator 914, memory 930, a mother-board of SoC 901, and/or any appropriate component of device 900.

In some embodiments, the device 900 comprises power measurement circuits 942, e.g., for measuring power consumed by one or more components of the device 900.

In some embodiments, the device 900 comprises one or more voltage regulator circuits 914, generally referred to as voltage regulators (VRs). VR 914 generates signals at appropriate voltage levels, which may be supplied to operate components of the device 900. Merely as an example, VR 914 is illustrated to be supplying signals to processor 904 of device 900. In some embodiments, VR 914 receives one or more Voltage Identification (VID) signals, and generates the voltage signal at an appropriate level, based on the VID signals. Various type of VRs may be utilized for the VR 914. For example, VR 914 may include a "buck" VR, "boost" VR, a combination of buck and boost VRs, low dropout (LDO) regulators, switching DC-DC regulators, constant-on-time controller-based DC-DC regulator, etc. Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity. In some embodiments, each processor core has its own VR, which is controlled by PCU 910a/b and/or PMIC 912. In some embodiments, each core has a network of distributed LDOs to provide efficient control for power management. The LDOs can be digital, analog, or a combination of digital or analog LDOs. In some embodiments, VR 914 includes current tracking apparatus to measure current through power supply rail(s).

The VR may comprise the circuits discussed previously for providing a PWM waveform, and a buck converter which is driven by the PWM waveform.

In some embodiments, the device 900 comprises a clock generator 916 which generates clock signals at appropriate frequency levels for any appropriate components of the device 900. Merely as an example, clock generator 916 is illustrated to be supplying clock signals to the processor 904 and the VR 914. In some embodiments, clock generator 916 receives one or more Frequency Identification (FID) signals, and generates the clock signals at an appropriate frequency, based on the FID signals. The clock waveform Ph_clk, discussed previously, is one example of a clock signal.

In some embodiments, the device 900 comprises a battery 918 supplying power to various components of the device 900 such as the processor 904.

In some embodiments, the device 900 comprises Power Control Units (PCUs) 910a and 910b. In an example, some sections of a PCU may be implemented by one or more processing cores 908a-908c, and these sections of the PCU are symbolically illustrated using a dotted box and labelled PCU 910a. In an example, some other sections of PCU may be implemented outside the processing cores 908, and these sections of PCU are symbolically illustrated using a dotted box and labelled as PCU 910b. The PCU may implement various power management operations for device 900.

In some embodiments, the device 900 comprises a Power Management Integrated Circuit (PMIC) 912, e.g., to implement various power management operations for the device 900.

In an example, the device 900 comprises the PCU and/or PMIC.

Various power management operations of device 900 may be performed by the PCU and/or by PMIC 912.

The clock generator 916 can comprise a phase locked loop (PLL), frequency locked loop (FLL), or any suitable clock source. In some embodiments, each core of processor 904 has its own clock source.

Also illustrated is an example software stack of device 900 (although not all elements of the software stack are illustrated). The processor 904 may execute application programs 950, Operating System 952, one or more Power Management (PM) specific application programs (e.g., generically referred to as PM applications 958). PM applications 958 may also be executed by the PCU and/or PMIC. OS 952 may also include one or more PM applications 956a, 956b, 956c. The OS 952 may also include various drivers 954a, 954b, 954c, some of which may be specific for power management purposes. In some embodiments, the device 900 may further comprise a Basic Input/output System (BIOS) 920. BIOS 920 may communicate with OS 952 via one or more of the drivers.

Some non-limiting examples of various embodiments are presented below.

Example 1 includes an apparatus, comprising: a variable current source; a capacitor coupled to the variable current source via a node and a first switch and to a discharge point via a second switch, wherein to provide a sawtooth waveform at the node, the capacitor is to be charged by the variable current source when the first switch is closed and the second switch is opened, and the capacitor is to discharge to the discharge point when the second switch is closed and the first switch is opened; and a comparator comprising an inverting input terminal coupled to the node and a non-inverting input terminal coupled to a first reference voltage; wherein the variable current source is to adjust a respective output current in response to a sample of an output signal from the comparator.

Example 2 includes the apparatus of claim 1 and further comprises: a pulse-width modulated (PWM) waveform generator coupled to the node and to a second reference voltage, wherein the PWM waveform generator is to generate a PWM waveform based on a comparison between a voltage of the sawtooth waveform and the second reference voltage.

Example 3 includes the apparatus of claim 2, wherein the PWM waveform generator is to change a level of the PWM waveform when the voltage of the sawtooth waveform crosses the second reference voltage.

Example 4 includes the apparatus of any of claims 1 to 3 and further comprises: a state machine coupled to the comparator and the variable current source, wherein the state machine is to provide a code word to the variable current source in response to the sample of the output signal, and the variable current source is to adjust the respective output current in response to the code word.

Example 5 includes the apparatus of claim 4, wherein the code word changes by one bit in response to the sample of the output signal.

Example 6 includes the apparatus of claim 4, wherein the code word changes by multiple bits in response to the sample of the output signal.

Example 7 includes the apparatus of any of claims 4 to 6, wherein a clock waveform generator to provide a clock waveform, wherein the sample of the output signal is obtained by the state machine responsive to a transition in the clock waveform once per period of the clock waveform.

Example 8 includes the apparatus of any of claims 1 to 7 and further comprises: a clock waveform generator to provide a clock waveform; and a delay circuit to provide a delayed version of the clock waveform, wherein the first switch is opened and the second switch is closed when the clock waveform is high and the delayed version of the clock waveform is low, and the first switch is closed and the second switch is opened when the clock waveform and the delayed version of the clock waveform are high.

Example 9 includes the apparatus of any of claims 1 to 8, wherein the first switch is to periodically close to connect the variable current source to the capacitor to charge the capacitor while the second switch is open; and the second switch is to periodically close to connect the capacitor to the discharge point to discharge the capacitor while the first switch is open.

Example 10 includes the apparatus of any of claims 1 to 9, wherein the discharge point comprises a ground node.

Example 11 includes an apparatus comprising: a variable current source; a first capacitor coupled to the variable current source via a first node, the first capacitor is coupled to a discharge point via a first switch, and is to be charged by the variable current source when the first switch is opened, and to be discharged to the discharge point when the first switch is closed, to provide a sawtooth waveform at the first node; a first comparator coupled to the first node; a second capacitor coupled to the first node; a second comparator comprising an inverting input terminal coupled to the second capacitor, a non-inverting input terminal coupled to a selectable voltage, and an output terminal; and a switch coupled to the inverting input terminal of the second comparator and to the output terminal of the second comparator, the switch is closed when the first capacitor is discharged to the discharge point and open when the first capacitor is charged by the variable current source; wherein the variable current source is to adjust a respective output current in response to a sample of an output signal from the first comparator, and the second comparator is to generate a pulse-width modulated (PWM) waveform on its output terminal based on a comparison between a voltage of its inverting input terminal and the selectable voltage of its non-inverting input terminal.

Example 12 includes the apparatus of claim 11, wherein the first comparator comprises an inverting input terminal coupled to the first node and a non-inverting input terminal coupled to a reference voltage.

Example 13 includes the apparatus of claim 11 or 12, wherein the selectable voltage is a first voltage when the first capacitor is discharged to the discharge point; the first voltage is used to auto-zero the second comparator; and the selectable voltage is a second voltage when the first capacitor is charged by the variable current source, the second comparator is to compare the second voltage to the voltage of the inverting input terminal to generate the PWM waveform.

Example 14 includes the apparatus of claim 13 wherein a waveform at the inverting input terminal of the second comparator corresponds to the sawtooth waveform upshifted by the first voltage.

Example 15 includes the apparatus of claim 13 or 14 wherein the second comparator is to generate the PWM waveform based on the comparison between the voltage of its inverting input terminal and the second voltage in a time period in which the first capacitor is charged by the variable current source and the switch is open.

Example 16 includes the apparatus of any one of claims 13 to 15 wherein the second comparator is to set the PWM waveform to high level in a time period in which the switch is closed.

Example 17 includes one or more non-transitory computer-readable media comprising instructions that, upon execution of the instructions by one or more processors of a circuit, are to cause the circuit to: generate a clock waveform for a state machine, the clock waveform is to trigger a state machine to sample an output of a first comparator, wherein the sample of the output is to indicate whether a voltage across a first capacitor exceeds a first reference voltage, and the state machine is to adjust a variable current source coupled to the first capacitor in response to the sample of the output; and generate a delayed version of the clock waveform, wherein the clock waveform and the delayed version of the clock waveform are separated by a delay period, and, to provide a sawtooth waveform at a node of the first capacitor, a first switch is to open to allow the variable current source to charge the first capacitor outside the delay period and the first switch is to close to discharge the first capacitor during the delay period.

Example 18 includes the one or more non-transitory computer-readable media of claim 17 wherein a second capacitor is coupled to the first capacitor to provide an upshifted version of the sawtooth waveform; and a pulse-width modulated (PWM) waveform generator is to receive the upshifted version of the sawtooth waveform.

Example 19 includes the one or more non-transitory computer-readable media of claim 18, wherein the PWM waveform generator is to generate a PWM waveform based on a comparison between the upshifted version of the sawtooth waveform and a comparison voltage (Vcomp) outside the delay period.

Example 20 includes the one or more non-transitory computer-readable media of claim 18, wherein the PWM waveform generator comprises a second comparator; and the second comparator is to auto-zero itself during the delay period.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:
1. An apparatus, comprising:
a variable current source;
a capacitor coupled to the variable current source via a node and a first switch and to a discharge point via a second switch, wherein to provide a sawtooth waveform at the node, the capacitor is to be charged by the variable current source when the first switch is closed and the second switch is opened, and the capacitor is to discharge to the discharge point when the second switch is closed and the first switch is opened; and
a comparator comprising an inverting input terminal coupled to the node and a non-inverting input terminal coupled to a first reference voltage;
wherein the variable current source is to adjust a respective output current in response to a sample of an output signal from the comparator.

2. The apparatus of claim 1, further comprising:
a pulse-width modulated (PWM) waveform generator coupled to the node and to a second reference voltage, wherein the PWM waveform generator is to generate a PWM waveform based on a comparison between a voltage of the sawtooth waveform and the second reference voltage.

3. The apparatus of claim 2, wherein:
the PWM waveform generator is to change a level of the PWM waveform when the voltage of the sawtooth waveform crosses the second reference voltage.

4. The apparatus of claim 1, further comprising:
a state machine coupled to the comparator and the variable current source, wherein the state machine is to provide a code word to the variable current source in response to the sample of the output signal, and the variable current source is to adjust the respective output current in response to the code word.

5. The apparatus of claim 4, wherein:
the code word changes by one bit in response to the sample of the output signal.

6. The apparatus of claim 4, wherein:
the code word changes by multiple bits in response to the sample of the output signal.

7. The apparatus of claim 4, further comprising:
a clock waveform generator to provide a clock waveform, wherein the sample of the output signal is obtained by the state machine responsive to a transition in the clock waveform once per period of the clock waveform.

8. The apparatus of claim 1, further comprising:
a clock waveform generator to provide a clock waveform; and
a delay circuit to provide a delayed version of the clock waveform, wherein the first switch is opened and the second switch is closed when the clock waveform is high and the delayed version of the clock waveform is low, and the first switch is closed and the second switch is opened when the clock waveform and the delayed version of the clock waveform are high.

9. The apparatus of claim 1, wherein:
the first switch is to periodically close to connect the variable current source to the capacitor to charge the capacitor while the second switch is open; and
the second switch is to periodically close to connect the capacitor to the discharge point to discharge the capacitor while the first switch is open.

10. The apparatus of claim 1, wherein:
the discharge point comprises a ground node.

11. An apparatus, comprising:
a variable current source;
a first capacitor coupled to the variable current source via a first node, the first capacitor is coupled to a discharge point via a first switch, and is to be charged by the variable current source when the first switch is opened, and to be discharged to the discharge point when the first switch is closed, to provide a sawtooth waveform at the first node;

a first comparator coupled to the first node;

a second capacitor coupled to the first node;

a second comparator comprising an inverting input terminal coupled to the second capacitor, a non-inverting input terminal coupled to a selectable voltage, and an output terminal; and a switch coupled to the inverting input terminal of the second comparator and to the output terminal of the second comparator, the switch is closed when the first capacitor is discharged to the discharge point and open when the first capacitor is charged by the variable current source;

wherein the variable current source is to adjust a respective output current in response to a sample of an output signal from the first comparator, and the second comparator is to generate a pulse-width modulated (PWM) waveform on its output terminal based on a comparison between a voltage of its inverting input terminal and the selectable voltage of its non-inverting input terminal.

12. The apparatus of claim 11, wherein:
the first comparator comprises an inverting input terminal coupled to the first node and a non-inverting input terminal coupled to a reference voltage.

13. The apparatus of claim 11, wherein:
the selectable voltage is a first voltage when the first capacitor is discharged to the discharge point;
the first voltage is used to auto-zero the second comparator; and
the selectable voltage is a second voltage when the first capacitor is charged by the variable current source, and the second comparator is to compare the second voltage to the voltage of the inverting input terminal to generate the PWM waveform.

14. The apparatus of claim 13, wherein:
a waveform at the inverting input terminal of the second comparator corresponds to the sawtooth waveform upshifted by the first voltage.

15. The apparatus of claim 13, wherein:
the second comparator is to generate the PWM waveform based on the comparison between the voltage of its inverting input terminal and the second voltage in a time period in which the first capacitor is charged by the variable current source and the switch is open.

16. The apparatus of claim 13, wherein:
the second comparator is to set the PWM waveform to high level in a time period in which the switch is closed.

17. One or more non-transitory computer-readable media comprising instructions that, upon execution of the instructions by one or more processors of a circuit, are to cause the circuit to:
generate a clock waveform for a state machine, the clock waveform is to trigger a state machine to sample an output of a first comparator, wherein the sample of the output is to indicate whether a voltage across a first capacitor exceeds a first reference voltage, and the state machine is to adjust a variable current source coupled to the first capacitor in response to the sample of the output; and
generate a delayed version of the clock waveform, wherein the clock waveform and the delayed version of the clock waveform are separated by a delay period, and, to provide a sawtooth waveform at a node of the first capacitor, a first switch is to open to allow the variable current source to charge the first capacitor outside the delay period and the first switch is to close to discharge the first capacitor during the delay period.

18. The one or more non-transitory computer-readable media of claim 17, wherein:
a second capacitor is coupled to the first capacitor to provide an upshifted version of the sawtooth waveform; and
a pulse-width modulated (PWM) waveform generator is to receive the upshifted version of the sawtooth waveform.

19. The one or more non-transitory computer-readable media of claim 18, wherein:
the PWM waveform generator is to generate a PWM waveform based on a comparison between the upshifted version of the sawtooth waveform and a comparison voltage (Vcomp) outside the delay period.

20. The one or more non-transitory computer-readable media of claim 18, wherein:
the PWM waveform generator comprises a second comparator; and
the second comparator is to auto-zero itself during the delay period.

* * * * *